United States Patent [19]
Cunningham

[11] 3,787,710
[45] Jan. 22, 1974

[54] INTEGRATED CIRCUIT STRUCTURE HAVING ELECTRICALLY ISOLATED CIRCUIT COMPONENTS

[76] Inventor: James A. Cunningham, 8434 Gladwood Ln., Richardson, Tex. 75080

[22] Filed: Jan. 25, 1972

[21] Appl. No.: 220,653

Related U.S. Application Data

[62] Division of Ser. No. 468,196, June 30, 1965.

[52] U.S. Cl. .......................... 317/101 A, 317/235 F
[51] Int. Cl. .......................................... H01l 19/00
[58] Field of Search ..................... 317/101 A, 235 F

[56] References Cited

UNITED STATES PATENTS

| | | | |
|---|---|---|---|
| 3,307,239 | 3/1967 | Lepselter et al. | 317/235 F |
| 3,312,879 | 4/1967 | Godejahn, Jr. | 317/235 F |
| 3,115,581 | 12/1963 | Kilby | 317/235 F |
| 3,335,338 | 8/1967 | Lepselter | 317/235 F |

*Primary Examiner*—David Smith, Jr.
*Attorney, Agent, or Firm*—Harold Levine; Jim T. Comfort; William E. Hiller

[57] ABSTRACT

A method of fabricating an integrated circuit having interconnected circuit components adjacent one surface of a semiconductor body having its opposite surface disposed upon an insulating layer on a substrate wherein the semiconductor material between the circuit elements is removed to form a moat or channel between the circuit elements and electrically isolate them from one another by the space remaining after the removal and the insulating layer.

8 Claims, 12 Drawing Figures

INTEGRATED CIRCUIT STRUCTURE HAVING ELECTRICALLY ISOLATED CIRCUIT COMPONENTS

This is a division of the application Ser. No. 468,196 filed June 30, 1965.

This invention relates to integrated circuits, and more particularly to miniature electronic circuits of the type having all of the necessary circuit components joined together by a common substrate but yet electrically isolated from each other.

The substantial growth of interest in microminiaturization and especially in that area of electronics commonly referred to as microelectronics has been reflected in the semiconductor field by the rapid development of integrated circuitry. By integrated circuitry is meant the formation of individual active and/or passive circuit components for an electronic circuit on a single piece of semiconductor material, preferably single crystal, the components being interconnected to form the desired circuit function. However, when a number of transistors and resistors are to be formed within a single substrate, with the substrate forming the collector region of each of the transistors it is necessary for many circuit applications to have the transistors isolated from each other to avoid having the collectors commoned, and also isolated from the resistors. Achieving adequate isolation between these components has been one of the prime objectives of integrated circuit development.

Many techniques have been developed to solve this problem, all of them possessing certain disadvantages. One such process, referred to as P-N junction isolation, involves producing a series of islands of one conductivity type semiconductor material within a substrate of opposite conductivity type material, and biasing the substrate with respect to the rest of the circuit so that the junctions separating the islands from the substrate are never forward biased. The islands form the collectors of transistors, and subsequent diffusions are made into these islands to form the base and emitter regions. Chief among the problems associated with this technique, however, is the fact that the inherent capacitance of the isolation junctions produces undesirable coupling at high frequencies. Also, the circuits and biasing levels must be designed so as to ensure that the isolation junctions are not forward biased at any time under normal operating conditions. Even if the junctions are maintained in a reverse biased condition, undesirable effects can result from leakage and from the collection of carriers by the isolation junction.

Another technique for isolation that has been proposed involves having the isolation islands in which the components are subsequently constructed consist of the original wafer material. Isolation is then achieved by selective diffusion of material of opposite conductivity type from each side of the wafer and completely through the wafer so that the diffusion fronts intersect. A disadvantage of this process is that the diffusions through the wafer require thin wafers and long diffusion times with high surface concentrations, resulting in high isolation capacitance.

With these difficulties in mind, it is an object of this invention to provide an improved method of isolation whereby all of the necessary circuit components of an integrated circuit are joined by a common substrate and yet are electrically isolated from each other. It is another object of this invention to provide an integrated circuit whereby the circuit components are electrically isolated through the substrate upon which they are formed, the isolation means not having a high capacitance associated with it, thereby allowing the particular integrated circuit to be used at very high frequencies and for very fast switching application. A further object is to provide a semiconductor device wherein a single crystal region or regions of very small size can be expediently formed in or on a semiconductor substrate but isolated from the substrate, specifically such a device wherein conductive leads to the device can be expanded out over the surface of the substrate as a film without discontinuities.

In accordance with these objects and other objects, features and improvements, the invention involves initially forming all of the necessary circuit components within a single crystal semiconductor wafer mounted on an insulating substrate by techniques known in the art thereafter providing leads and interconnections between the various circuit components to produce the desired circuit function, and then selectively etching channels or moats between each of the various interconnected circuit components in order to remove the semiconductor material around and under the leads and interconnections down to the insulating substrate. As a consequence each of the individual interconnected components are isolated from each other by the etched moats or channels and by the insulating substrate. Although of principal utility in the manufacture of integrated circuits this technique also lends itself to the formation of single transistors or the like having very high frequency operating characteristics.

The novel features believed to be characteristic of this invention are set forth with particularity in the appended claims. The invention itself, however, as well as further objects and advantages thereof may best be understood by reference to the following detailed description of an illustrative embodiment when read in conjunction with the appended claims and the drawings, wherein:

Figures 1, 2, 3, 4:
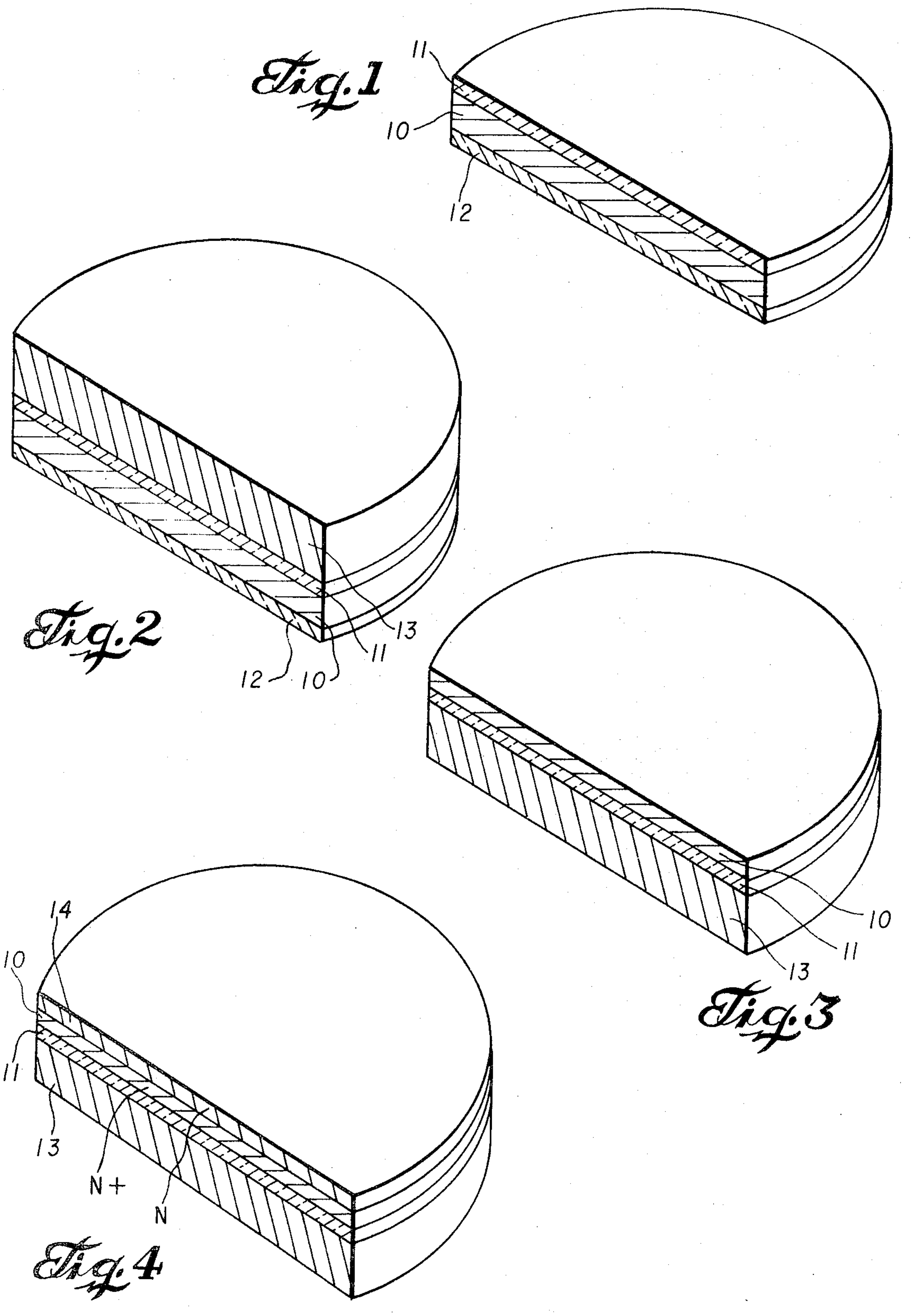
FIGS. 1–4 are pictorial views in section of a semiconductor slice in the early stages of the production of an integrated circuit in accordance with the process of this invention.

Referring now to FIG. 1 there is described the first step in this invention. A slice 10 of single crystal low-resistivity N+ semiconductor material, such as silicon, having a resistivity of perhaps 0.010 to 0.025 ohms per centimeter is used as the starting material. This slice may be about 1 inch in diameter and approximately 10 mils thick. The top and bottom surfaces of the slice 10 are covered with insulating coatings 11 and 12, which may be silicon oxide, for example, these coatings being formed by any conventional technique to thicknesses of perhaps 10,000 A. For instance, the oxide coatings 11 and 12 may be thermally grown by exposing the slice 10 to steam at about 1,200° C for a sufficient period of time. An alternative method of forming the oxide layers 11 and 12, however, would be the "oxidative" technique, by which oxygen and tetraethoxysilane are reacted in vapor form at 250°–500° C in the presence of the wafer 10. The reaction mixture is obtained by bubbling oxygen through liquid tetraethoxysilane at room temperature, then combining the gaseous mixture with excess oxygen and passing it into a furnace tube containing the slice 10 where the oxidation takes place. The silicon oxide thereby produced is deposited upon the upper and lower surfaces or faces of the slice 10. The advantage of this latter process is the relatively low temperatures at which uniform oxide coatings may be formed.

As the next step in the invention, as depicted in FIG. 2, the oxide coated wafer 10 is placed in an epitaxial reactor to produce the top layer 13 which eventually becomes the substrate. Within the reactor a layer 13 of semiconductor material is vapor deposited over the top surface of the oxide coated slice 10. The most common method of vapor deposition is by the hydrogen reduction of silicon tetrachloride, a technique well known in the art and requiring no elaboration here. The conductivity type of the layer 13 may be N-type, P-type or intrinsic, and the actual crystal orientation of the semiconductor layer 13 is not critical since its primary function is that of a support or base upon which the various integrated circuit components are formed. Due to the fact that the layer 13 is being deposited upon the oxide coating 11, however, the layer would in most probability be either polycrystalline or amorphous, instead of monocrystalline. The thickness of the layer 13 should be perhaps seven or eight mils or more to facilitate handling the unit without breakage. The structure of FIG. 2 is then subjected to a lapping and polishing operation, for example in order to remove the oxide layer 12 and substantially all of the low-resistivity N+ semiconductor material 10 except for a thin portion having a thickness of approximately 1 mil. The lapped and polished structure is then rotated 180°, the resulting structure depicted in FIG. 3, whereby the layer 13 now forms the substrate, the low-resistivity semiconductor material 10 being separated from said substrate by the oxide layer 11.

As the next step in the process, the structure of FIG. 3 is subjected to an epitaxial deposition step whereby, as shown in FIG. 4, a layer 14 of high-resistivity N-type semiconducting material will be deposited upon the low-resistivity layer 10. The high-resistivity layer 14 now serves as a region into which subsequent diffusions or upon which epitaxial depositions may be made in order to fabricate various components of an integrated circuit.

Figure 5:
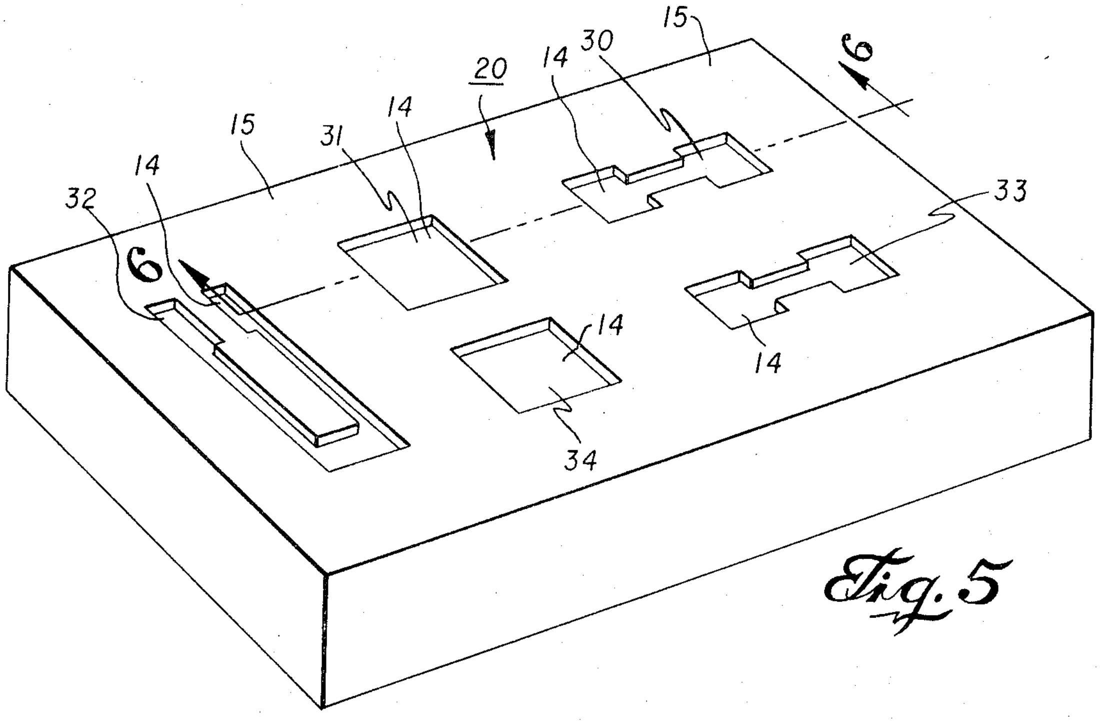
FIG. 5 represents a pictorial view of a small segment of the slice shown in FIGS. 1–4.
Figure 6:
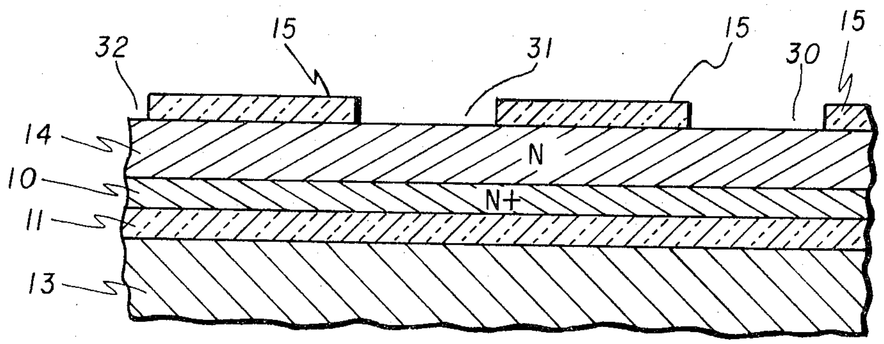
FIGS. 6 and 7 are sectional views of a portion of the segment of FIG. 5 taken along the line 6—6 showing subsequent steps of the process of this invention.

In accordance with this objective, reference is to FIG. 5 where a small segment of the slice shown in FIG. 4 is represented as a chip or wafer 20 which represents the segment occupied by one integrated circuit. Actually the slice would contain in undivided form dozens or even hundreds of the segments such as the wafer 20. An oxide layer 15, for example silicon oxide, is formed over the top of the wafer segment 20 so as to completely cover the high-resistivity layer 14. Through the use of photographic masking and etching techniques known in the art, select portions of the oxide layer 15 are removed in the patterns 30–20 shown in FIG. 5 so as to expose corresponding portions of the high-resistivity region 14 under the oxide layer 15. A cross-sectional view through a portion of the wafer 20 is pictured in FIG. 6. It is to be observed that the exposed portions of the high-resistivity substrate 14 are the regions into which subsequent diffusions are now made in order to fabricate the various components of an integrated circuit.

Figure 7:
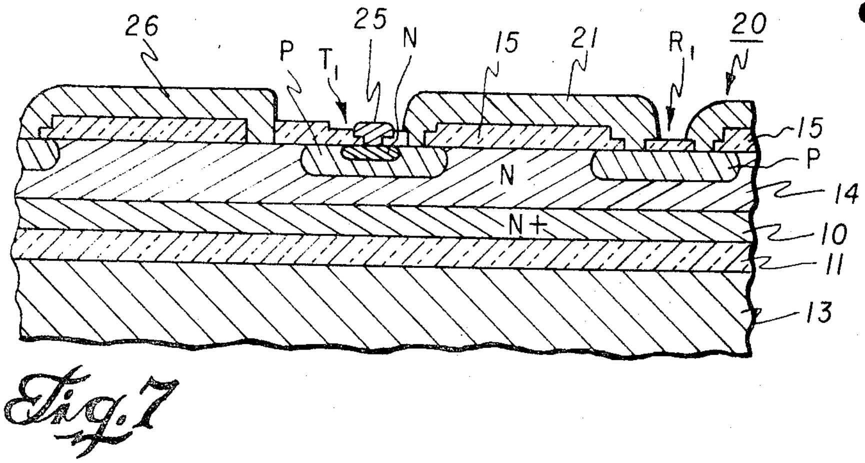

Referring now to FIG. 7, a sectional view of a portion of a completed integrated circuit is seen, with an NPN transistor $T_1$ and a resistor $R_1$ having been formed in the N-type layer by diffusion. A P-type diffused region provides the base of the transistor, while an elongated P-type region formed simultaneously with the base provides the resistor $R_1$. An N-type diffused region provides the transistor $T_1$ emitter. The diffusion operation utilizes silicon oxide masking so that the oxide layer 15 acquires a stepped configuration in the final device. Openings are made in the oxide where contact is necessary, then metal film is deposited over the oxide and selectively removed to provide the desired contacts and interconnections. The lead interconnection 21 connects the base of the transistor $T_1$ to one end of the resistor $R_1$, and the metal regions 25 and 26 form the emitter and collector leads respectively. In order to make a low resistance contact to the collector region of the transistor $T_1$, it may be desirable to first form a low resistance N+ region by diffusion at the location where the lead 26 is to make ohmic contact.

The formation of the leads or interconnections 21, 25 and 26, for example, may be accomplished by any conventional technique known in the art such as vacuum evaporation, and the leads themselves may be formed of any appropriate material. In accordance with a preferred embodiment, however, it is desirable to use materials for the leads or interconnections which do not tend to degrade the semiconductor device by their presence, which lend themselves to manufacturing techniques compatible with other processes used on the devices, and which permit working with very small geometries. In the specific case of silicon devices, the objects are to provide a contact and interconnection arrangement which adheres well to silicon and to silicon oxide surfaces without reacting unfavorably with either, which can be used with available photoresist masking and etching procedures, which forms an ohmic and low resistance electrical connection to the silicon, which can be applied readily by metal evaporation techniques, which have a high conductivity, and which can be bonded with gold wires. A combination of metals almost uniquely commensurate with the above objectives is found to be molybdenum and gold. Accordingly, a thin film of molybdenum is first applied over the entire face of the silicon wafer 20 having the silicon oxide coating 15 with the openings etched in the contact areas. Then the molybdenum is covered with a thin film of gold and thereafter the gold and molybdenum are etched away in the unwanted areas leaving the desired pattern of contacts and interconnections 21, 25 and 26 on the silicon surface and on the oxide.

Figure 8:
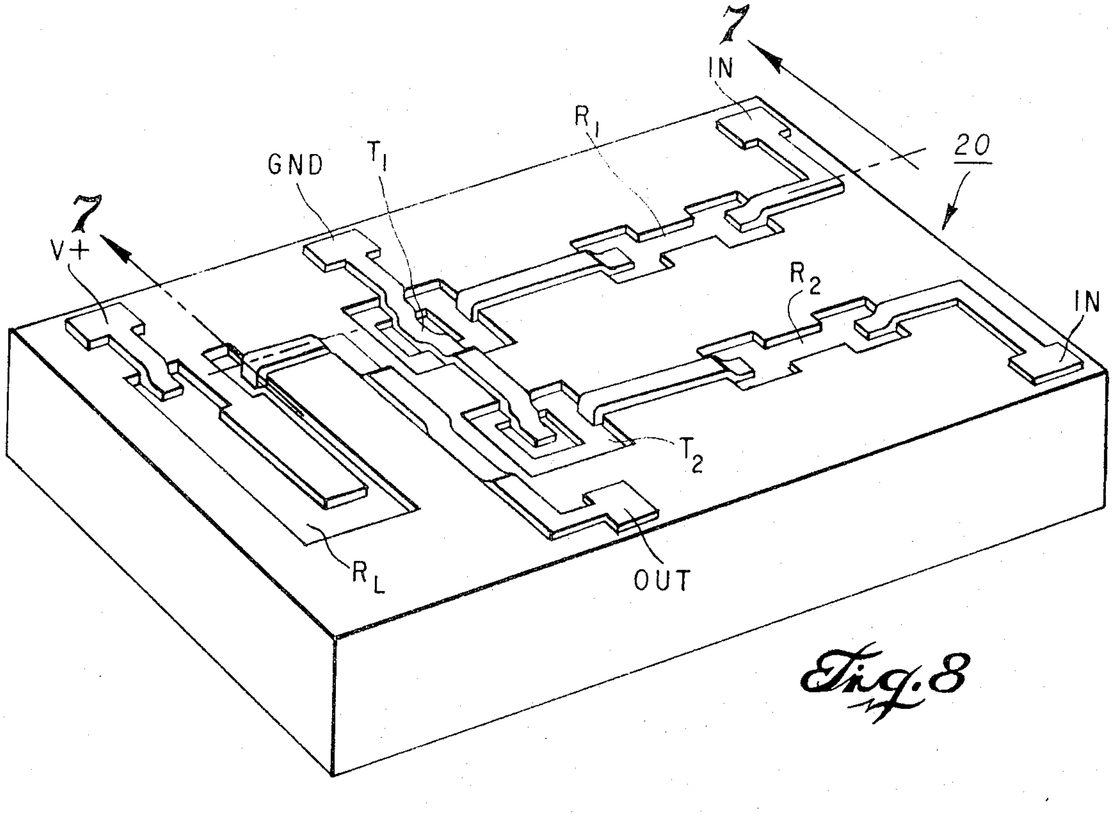
FIG. 8 is a pictorial view of the completed device described with reference to FIGS. 1–7 before the individual interconnected circuit components have been electrically isolated from each other.

A top view of the wafer 20 is shown in FIG. 8 after the individual circuit components have been formed, and the leads and innerconnections have been deposited in their desired locations. At this stage of production the individual circuit components are formed within the wafer 20 but are not electrically isolated from each other.

Figure 9:
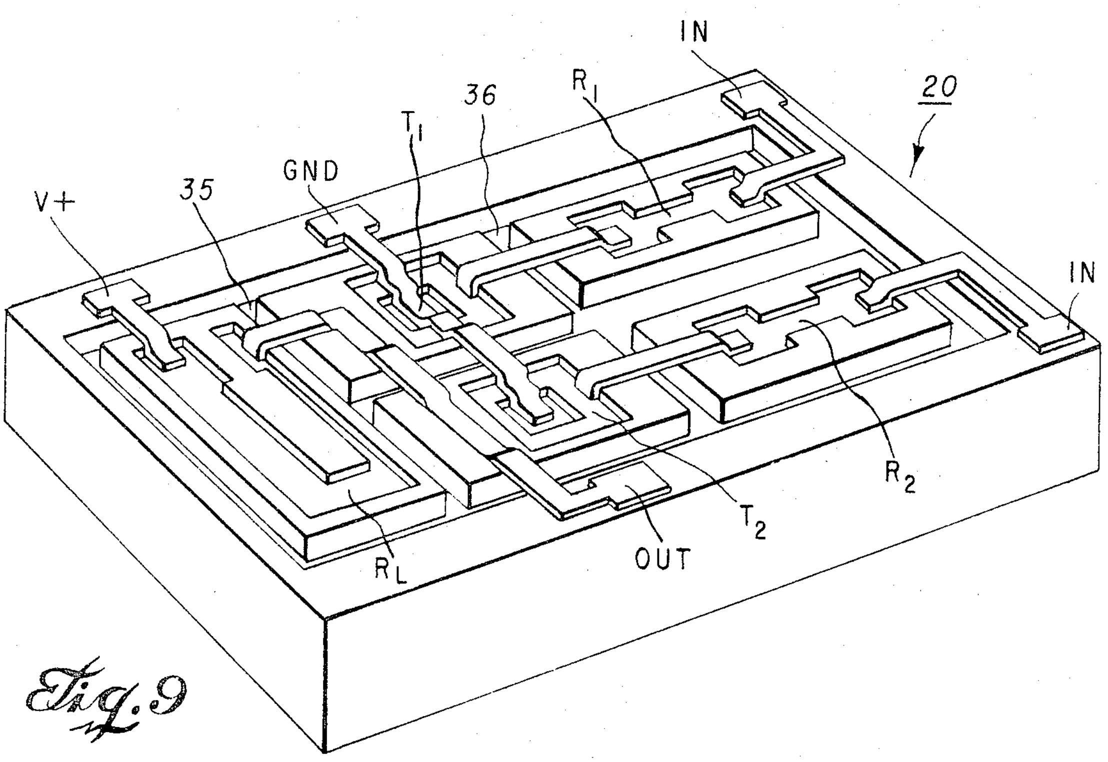
FIG. 9 is a pictorial view of the completed device shown in FIG. 8 after the isolation technique of this invention has been completed.

The electrical isolation of each of the components from each other is accomplished by forming a series of channels or moats completely surrounding each of the components, as depicted in FIG. 9. The various leads between the components then cross over the channels in order to make the desired interconnections.

The formation of the moats or channels is achieved by a photographic masking and etching technique now described with reference to FIG. 10, a sectional view of a portion of the wafer 20 through the channel regions 35 and 36. A layer of photoresist material of the type disclosed in U. S. Pat. Nos. 2,670,285; 2,670,286 and 2,670,287 of L. M. Minsk, or of the type available from the Eastman Kodak Company under the trade name "KMER" or "KTFR," preferably the latter, is coated over the top surface of the slice 20. A photomask is then placed upon the photoresist to mask the regions where the moats or channels are to be formed, and the unmasked portions of the photoresist are then exposed and developed by photographic means. The top surface of the slice 20 is then subjected to etchants which selectively remove the oxide layer 15 and the underlying silicon layers 14 and 10 in the masked regions down to the oxide layer 11 leaving the leads and interconnections intact and forming the channel areas 35 and 36, for example, as shown in FIG. 10.

The particular etchants used should be of the type that will not attack the leads and interconnections. For example, an integrated circuit structure was fabricated as described with the leads or interconnections formed of molybdenum and gold. After the wafer with the components formed therein was coated with photoresist and masked as described, the top surface of the wafer 20 was subjected to an ammonium monohydrogen fluoride ($NH_4HF_2$) chemical etchant which selectively removed portions of the silicon oxide layer 15 beneath the leads 21 and 26 (the extent of the removal represented by the dotted line 15A) while leaving the underlying silicon material substantially unaffected. The masked surface of the wafer was then subjected to a chemical etchant composed of a mixture of nitric, hydrofluoric, and acetic acids which selectively removed portions of the silicon layers 14 and 10 beneath the dotted lines 15A as shown while leaving the unremoved portion of the silicon oxide layer 15 and the silicon oxide layer 11 substantially unaffected.

Figure 10:
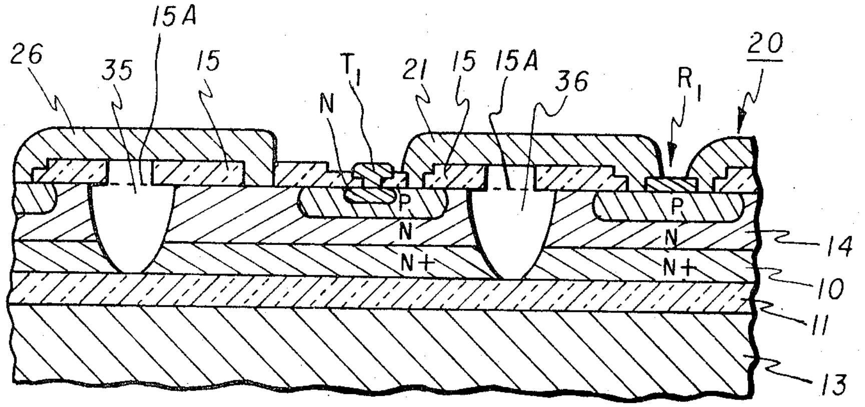
FIG. 10 is a sectional view of a portion of the completed circuit shown in FIG. 9 taken along the line 10—10.
Figure 11:
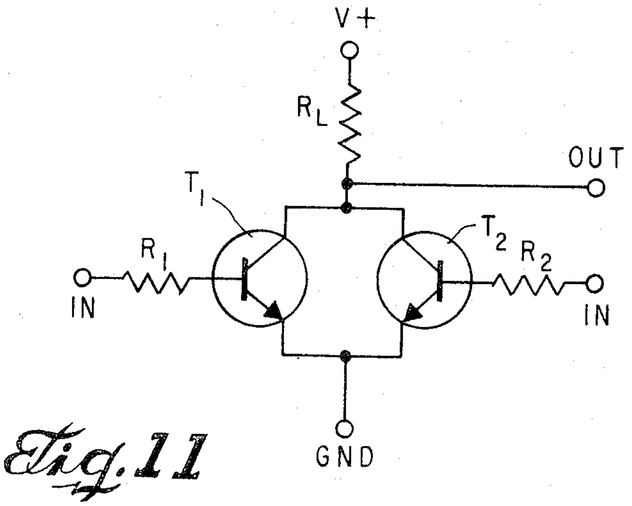
FIG. 11 is a schematic diagram of the integrated circuit contained within the segment shown in FIG. 8.

The resulting structure is shown in FIG. 10 whereby the components $T_1$ and $R_1$, for example, are electrically isolated from each other by the moat or channel 36 and the oxide layer 11, and the lead or interconnection 21 bridges the gap between these components. With ordinary metal deposition techniques being used, the lead 21 was unaffected by the etching operation and was found to be quite strong, elven though it bridged the moat 36. The bridged leads withstood further processing steps, such as spraying the structure with alcohol at high pressure in order to remove the photoresist used for the masking operation, without failure, i.e., without breakage of the cantilevered or bridged leads. If desired, it is possible to increase the thickness of the cantilevered leads by electroplating gold, for example, through an appropriate mask, KMER for example, thereby improving the lead strength. As a result of the above-described process, the completed unit is seen in FIG. 9 with the transistors $T_1$ and $T_2$ and the resistors $R_1$, $R_2$, and $R_L$ completely isolated from each other through the wafer 20, the metal film interconnections providing a logic circuit as seen in schematic form in FIG. 11.

While the invention has been described with reference to a specific method and embodiment, it is to be understood that this description is not to be construed in a limiting sense. The basic concept which has been described so far is the isolation of individual interconnected circuit components through the substrate in which they have been formed by etching away select portions of the material between the components with chemical etchants that leave the interconnections substantially unaffected. Any techniques or etchants that accomplish this objective besides those specifically described above are also encompassed by this invention.

In addition to the specific integrated circuit structures that have been described, it is obvious that using the process of this invention, a multitude of configurations of circuit components may be formed within a single substrate. For example, in addition to forming transistors, diodes and resistors, other components like metal oxide semiconductor devices, field effect transistors, and oxide dielectric capacitors may be fabricated, interconnected to perform desired circuit functions, and then electrically isolated from each other according to this invention. Similarly, although the initial starting slice was described as low resistivity N+ semiconductor material, high resistivity and/or P-type material may also be employed.

The above described process, although particularly useful in the field of integrated circuits, is also useful in the fabrication of single devices mounted upon an insulating substrate. In accordance with the latter objective, reference is to FIG. 12 wherein is depicted an NPN transistor 40 comprising an N-type collector layer 44, a P-type diffused base region 45, and an N-type diffused emitter region 46. The transistor 40 is formed upon the semiconductor substrate 41 separated therefrom by the oxide layer 42 in substantially the same manner as the process described for the transistor $T_1$, for example, with reference to FIGS. 1–11. This process leaves an oxide coating 57 upon the top surface of the wafer, the coating being in a stepped configuration due to the successive diffusion operations. For high frequency applications, the geometry of the active part of the transistor 40 is extremely small, the emitter region 46 being only a few hundredths of a square mil in area in some cases.

The collector, base, and emitter contact to this transistor are provided by metal strips 51, 56 and 48 respectively, which extend into holes etched in the oxide coating 57 in make ohmic contact to the appropriate regions. The strips terminate respectively in enlarged bonding pads 52, 55 and 49.

This expanded contact arrangement is necessary to high frequency devices becuase of the previously mentioned extremely small size of the active regions of the transistor 40. However, if the contacts are no larger than the active regions, it is virtually impossible to bond external lead wires to these contacts, and so the expanded thin strips (for making contact to the active regions) with the enlarged bonding pads (for external connections) are needed. There is necessarily associated with this expanded contact arrangement, however, a capacitance, due to the fact that the expanded contacts extend over the oxide layer 57 (which acts as the dielectric layer), this capacitance causing undesirable coupling at high frequencies.

Figure 12:
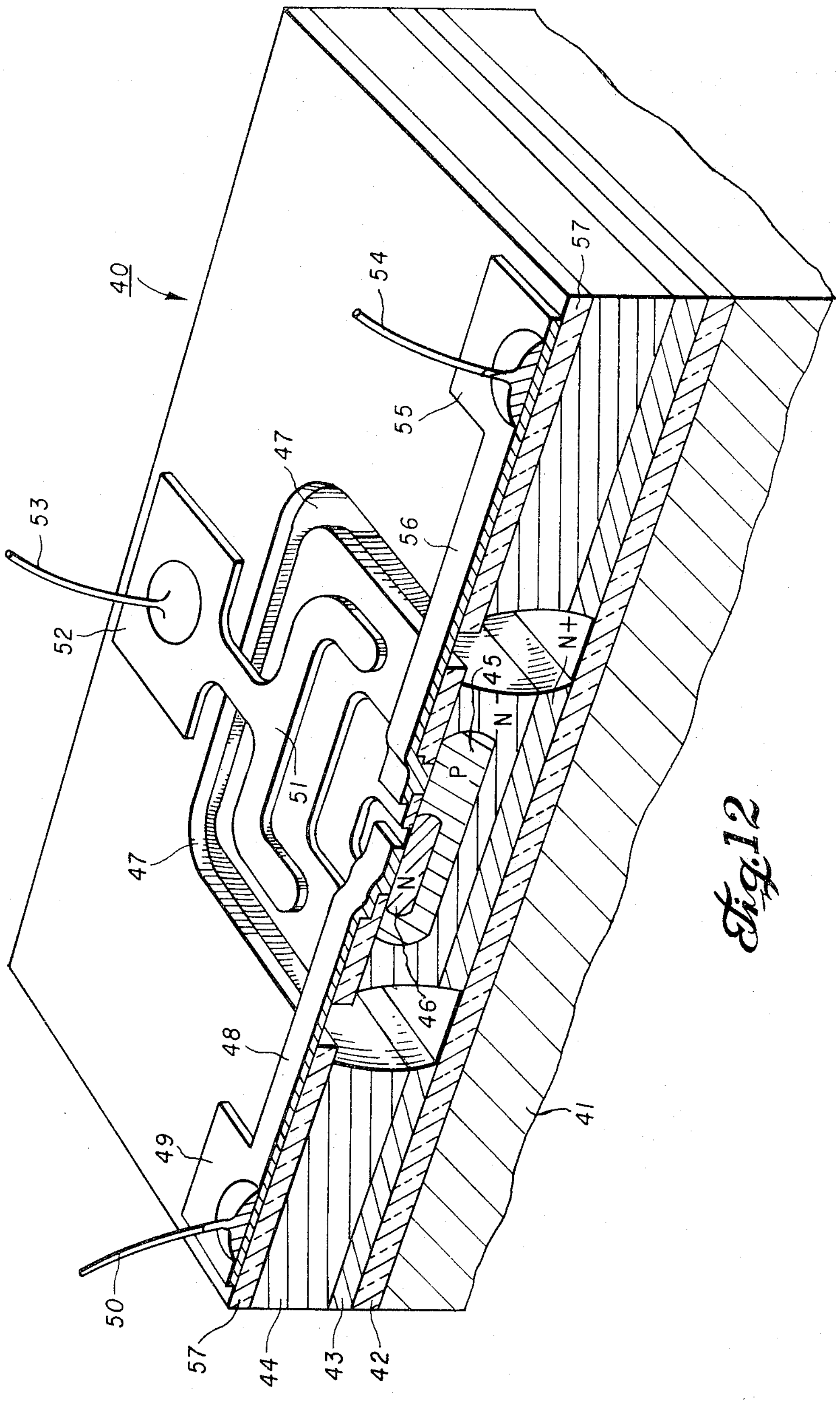
FIG. 12 is a pictorial view in section showing the fabrication of a single high frequency transistor according to this invention.

To reduce these capacitive effects, the channel or moat 47 is etched completely around the active portions of the transistor 40, as shown in FIG. 12, thereby isolating the active regions from the bonding pads and substantial portions of the elongated metal strips. The formation of the moat or channel 47 is accomplished in the same manner as previously described with reference to FIGS. 9 and 10. As a consequence, small geometry high frequency transistor 40 is provided having thin film continuous metallic leads from the various active regions to the respective bonding pads, while at the same time maintaining the coupling capacitance associated with such an arrangement at a minimum. To even further minimize any coupling capacitance, channels or moats may also be formed in like manner completely surrounding each of the bonding pads so as to isolate pads from each other.

Various other modifications of the disclosed embodiments as well as other embodiments of the invention, may become apparent to persons skilled in the art without departing from the spirit and scope of the invention as defined by the appended claims.

I claim:

1. A semiconductor device structure comprising:
an insulating substrate,
a semiconductor body including a plurality of semiconductor regions disposed upon said insulating substrate,
an insulating layer at least partially covering the surface of said semiconductor body opposite from said insulating substrate,
selectively etched-out regions formed in said semiconductor body and extending through the thickness of said semiconductor body and said insulating layer to define at least one channel extending between and separating at least two of said semiconductor regions to provide electrical isolation therebetween,
a circuit component within at least one of said semiconductor regions,
said insulating layer being provided with an opening therethrough in registration with a portion of said circuit component, and
a metallic layer of substantially uniform thickness defining an elongated electrically conductive lead connected to said circuit component through the opening in said insulating layer, said metallic layer being arranged in juxtaposed engaging relation to said insulating layer except for a portion thereof extending across and bridging said at least one channel.

2. A semiconductor device structure as set forth in claim 1, further including
a circuit component within at least the other of said two separated electrically isolated semiconductor regions, and
said metallic layer extending into connecting engagement with the circuit component within said other semiconductor region so as to provide an ohmic interconnection between said circuit components of said two separated electrically isolated semiconductor regions, whereby said semiconductor device structure comprises an integrated circuit.

3. A semiconductor device structure as set forth in claim 1, wherein said insulating substrate comprises a composite substrate including a support layer of semiconductor material, and an insulating layer covering said support layer of said semiconductor material and on which said semicondcutor body is disposed.

4. A semiconductor device structure as set forth in claim 3, wherein said support layer is made of polycrystalline semiconductor material.

5. A semiconductor device structure comprising:
an insulating substrate,
a semiconductor body including a plurality of semiconductor regions disposed upon said insulating substrate,
an insulating layer at least partially covering the surface of said semiconductor body opposite from said insulating substrate,
selectively etched-out regions formed in said semiconductor body and extending through the thickness of said semiconductor body and said insulating layer to define at least one channel extending between and separating at least two of said semiconductor regions to provide electrical isolation therebetween,
a circuit component within at least one of said semiconductor regions,
said insulating layer being provided with an opening therethrough in registration with a portion of said circuit component, and
a metallic layer of substantially uniform thickness defining an elongated electrically conductive lead connected to said circuit component through the opening in said insulating layer, said metallic layer including a portion extending across and bridging said at least one channel and disposed transversely with respect to the longitudinal extent of said channel such that a major portion of the mouth of said channel is open on the surface of said insulating layer remote from said semiconductor body, and the remainder of said metallic layer bieng arranged in juxtaposed engaging relation to said insulating layer on both sides of said channel.

6. A semiconductor device structure as set forth in claim 5, wherein said selectively etched-out regions define a plurality of channels which are are so positioned as to separate respective ones of said semiconductor regions from other semiconductor regions included in said plurality of semiconductor regions to provide electrical isolation between each pair of semiconductor regions so separated,
at least some of said semiconductor regions having a circuit component therewithin,
said metallic layer being a patterned metallic layer at least providing a plurality of individual elongated electrically conductive leads selectively providing ohmic interconnections between circuit components of respective semiconductor regions in a predetermined manner to comprise an integrated circuit,
each of said plurality of elongated conductive leads including a portion extending across and bridging a respective one of said channels and disposed transversely with respect to the longitudinal extent thereof, the remainder of said conductive lead being disposed in juxtaposed engaging relation to said insulating layer on both sides of the said one channel, and a major portion of the mouth of each of said plurality of channels being open on the surface of said insulating layer remote from said semiconductor body.

7. A semiconductor device structure comprising:

an insulating substrate, a semiconductor body including a plurality of semiconductor regions disposed upon said insulating substrate, an insulating layer at least partially covering the surface of said semiconductor body opposite from said insulating substrate, selectively etched-out regions formed in said semiconductor body and extending through the thickness of said semiconductor body and said insulating layer to define at least one channel extending between and separating at least two of said semiconductor regions to provide electrical isolation therebetween, a circuit component within at least one of said semiconductor regions, said insulating layer being provided with an opening therethrough in registration with a portion of said circuit component, a metallic layer of substantially uniform thickness disposed on said insulating layer and defining an elongated electrically conductive lead connected to said circuit component through the opening in said insulating layer, said metallic layer being arranged in juxtaposed engaging relation to said insulating layer except for a portion thereof extending across and bridging said at least one channel, and said metallic layer terminating at one end thereof in an enlarged bonding pad comprising an expanded contact on the side of said channel remote from the semiconductor region in which said circuit component is disposed.

8. A semiconductor device structure comprising:

an insulating substrate, a semiconductor body including a plurality of semiconductor regions disposed upon said insulating substrate, said plurality of semiconductor regions including a first region of one conductivity type material disposed adjacent to said insulating substrate, a second region of opposite conductivity material disposed within said first region, and a third region of said one conductivity type material disposed within said second region, each of said first, second, and third semiconductor regions extending to the surface of said semiconductor body remote from said insulating substrate and defining portions of said surface of said semiconductor body, an insulating layer at least partially covering said surface of said semiconductor body remote from said insulating substrate including portions of said first, second, and third semiconductor regions, selectively etched-out regions formed in said semiconductor body and extending through the thickness of said semiconductor body and said insulating layer to define an endless channel within which said first, second, and third semiconductor regions are enclosed to separate said first, second, and third semiconductor regions from the remainder of said semiconductor body to provide electrical isolation therefor, said insulating layer being provided with respective openings therethrough in registration with portions of said first, second, and third semiconductor regions, a patterned metallic layer of substantially uniform thickness disposed on said insulating layer and defining a plurality of elongated electrically conductive leads connected to corresponding ones of said first, second, and third semiconductor regions through the respective openings in said insulating layer, said electrically conductive leads being arranged in juxtaposed engaging relation to said insulating layer except for respective portions thereof extending across and bridging said endless channel within which said first, second, and third semiconductor regions are disposed, and each of said electrically conductive leads including an enlarged bonding pad comprising an expanded contact at the end thereof disposed on said insulating layer outwardly with respect to said endless channel and remote from the connection of said lead to the corresponding one of said first, second, and third semiconductor regions.

* * * * *